United States Patent [19]

Dumoulin et al.

[11] Patent Number: 5,419,325
[45] Date of Patent: May 30, 1995

[54] MAGNETIC RESONANCE (MR) ANGIOGRAPHY USING A FARADAY CATHETER

[75] Inventors: Charles L. Dumoulin, Ballston Lake, N.Y.; Steven P. Souza, Williamstown, Mass.

[73] Assignee: General Electric Company, Schenectady, N.Y.

[21] Appl. No.: 264,282

[22] Filed: Jun. 23, 1994

[51] Int. Cl.⁶ ............................................. A61B 5/055
[52] U.S. Cl. ............................ 128/653.2; 128/653.4; 128/654; 128/658; 128/899
[58] Field of Search ................... 128/653.2, 653.4, 654, 128/899, 658; 324/306

[56] References Cited

U.S. PATENT DOCUMENTS

| | | | |
|---|---|---|---|
| 4,572,198 | 2/1986 | Codrington | 128/653.2 |
| 4,989,608 | 2/1991 | Ratner | 128/653.2 |
| 5,243,283 | 9/1993 | Tokunaga et al. | 324/309 |
| 5,271,400 | 12/1993 | Dumoulin et al. | 128/653.2 |
| 5,307,808 | 5/1994 | Dumoulin et al. | 128/653.2 |
| 5,318,025 | 6/1994 | Dumoulin et al. | 128/653.2 |

Primary Examiner—Lee S. Cohen
Assistant Examiner—Brian L. Casler
Attorney, Agent, or Firm—Lawrence P. Zale; Marvin Snyder

[57] ABSTRACT

A magnetic resonance (MR) angiography system employs a Faraday catheter for generating MR angiograms of selected blood vessels. A subject is first placed in a polarizing magnetic field. The Faraday catheter is then inserted into a selected blood vessel of the subject at or near the root of a vessel tree desired to be imaged. An MR imaging pulse sequence is then applied to the subject to obtain image information from the region containing the desired vessel tree. Fluid inside the Faraday catheter is shielded from the RF pulses of the MR imaging sequence allowing the fluid to be in a relaxed state, while tissue outside the Faraday catheter is on a steady-state. As the fluid exits the catheter, and before it reaches steady-state, it produces an increased MR response signal causing the desired vessel tree to be imaged.

4 Claims, 3 Drawing Sheets

MAGNETIC RESONANCE (MR) ANGIOGRAPHY USING A FARADAY CATHETER

CROSS REFERENCES TO RELATED APPLICATIONS

This application is related to U.S. patent applications (Atty. Docket No. RD-23,536) "Method For Blood Flow Acceleration and Velocity Measurement Using MR Catheters" by Darrow, Dumoulin; (Atty. Docket No. RD-23,539); "Magnetic Resonance (MR) Angiography in A Low-Field Imaging Magnet" by C. Dumoulin, R. Darrow; "Tracking System and Pulse Sequences to Monitor the Position and Orientation of a Device Using Magnetic Resonance" Ser. No. 07/861,718; by Dumoulin, Souza, Darrow, filed Apr. 1, 1992; all assigned to the present assignee, and all incorporated by reference.

BACKGROUND OF THE INVENTION

1. Field of the Invention

The present invention relates to medical imaging of blood vessels, and more particularly concerns the use of magnetic resonance to obtain such imaging.

2. Description of Related Art

Angiography, or the imaging of vascular structures, is very useful in diagnostic and therapeutic medical procedures. In X-ray angiography, a bolus of x-ray opaque liquid is placed into the vessel of interest through an invasive device placed into the vessel. While the bolus is within the vessel, a series of X-ray images is obtained which highlight the X-ray absorbing liquid.

X-ray angiography carries several significant risks to the patient. For example, the x-ray opaque liquid can cause discomfort and adverse reactions within the patient. While conventional X-ray fluoroscopes are designed to minimize X-ray dosage, some procedures can be very long and the accumulated X-ray dose to the subject can become significant. The long term exposure of the attending medical staff is of even greater concern since they participate in these procedures regularly. Consequently, it is desirable to reduce or eliminate the X-ray dose during these procedures.

X-ray angiography, typically produces a single two-dimensional image. Information concerning the depth of an object within the field-of-view is not available to the operator. It is often desirable to obtain this information during diagnostic and therapeutic procedures.

Magnetic resonance (MR) imaging procedures for the imaging of vascular structures have recently become available. MR angiography is performed with a variety of methods, all of which rely on one of two basic phenomena. The first phenomena arises from changes in longitudinal spin magnetization as blood moves from one region of the patient to another. Methods that make use of this phenomenon have become known as "in-flow" or "time-of-flight" methods. A commonly used time-of-flight method is three-dimensional time-of flight angiography. With this method, a region of interest is imaged with a relatively short repetition time, TR, and a relatively strong excitation radiofrequency (RF) pulse. This causes the MR spins within the field-of-view to become saturated and give weak MR response signals. Blood flowing into the field-of-view, however, enters in a fully relaxed state. Consequently, this blood gives a relatively strong MR response signal, until it too becomes saturated. Because of the nature of blood vessel detection with time-of-flight methods, the stationary tissue surrounding the vessel cannot be completely suppressed. In addition, slowly moving blood, and blood that has been in the imaged volume for too long, becomes saturated and is poorly imaged.

A second type of MR angiography is based on the induction of phase shifts in transverse spin magnetization. These phase shifts are directly proportional to velocity and are induced by flow-encoding magnetic field gradient pulses. Phase-sensitive MR angiography methods exploit these phase shifts to create images in which the pixel intensity is a function of blood velocity. While phase-sensitive MR angiography can easily detect slow flow in complicated vessel geometries, it will also detect any moving tissue within the field-of-view. Consequently, phase-sensitive MR angiograms of the heart have artifacts arising from the moving heart muscle and from the moving pools of blood in the heart chambers.

Several methods for the tracking of an interventional device using MR have also been disclosed. These have been described in the U.S. Patent applications previously mentioned in 'CROSS REFERENCES TO RELATED APPLICATIONS'. Following an invasive device within a patient using these MR techniques has the advantage that the invasive device location is determined using the same physical relationships used to make the MR image. Consequently, the registration of invasive device position with respect to the image is excellent. These, however, do not specifically image blood vessels, but provide MR images with a superimposed symbol representing the position of an invasive device.

Currently, there is a need for a simple method of obtaining high quality angiograms of a selected vessel without the risks of exposure to ionizing radiation and X-ray opaque contrast injections.

SUMMARY OF THE INVENTION

A catheter is placed in the vascular tree of a patient during an MR scan. The catheter is constructed in part with an electrically conducting material, and acts as a Faraday cage for the fluid contained within the lumen of the catheter. An MR imaging sequence is then performed. The pulse sequence is chosen to cause saturation of the nuclear spins within the field-of-view. Fluid is injected through the catheter and into the vascular space during the MR exam. Since the catheter acts as a Faraday cage, the fluid entering the vascular space is not subjected to the nutating effects of the RF pulses of the MR pulse sequence. Consequently, this fluid gives a strong MR signal, while that of the surrounding tissue is weak due to spin saturation. MR angiography performed in this way should be well suited for imaging the coronary arteries.

OBJECTS OF THE INVENTION

It is an object of the present invention to provide a system for imaging selected blood vessels using magnetic resonance.

It is another object of the present invention to provide a method of MR angiography which employs an invasive device to modify the magnetic resonance state of blood within the detected vessel tree.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

FIG. 3b is a schematic diagram of the embodiment presented in FIG. 3a.

DETAILED DESCRIPTION OF THE INVENTION

Figure 1:
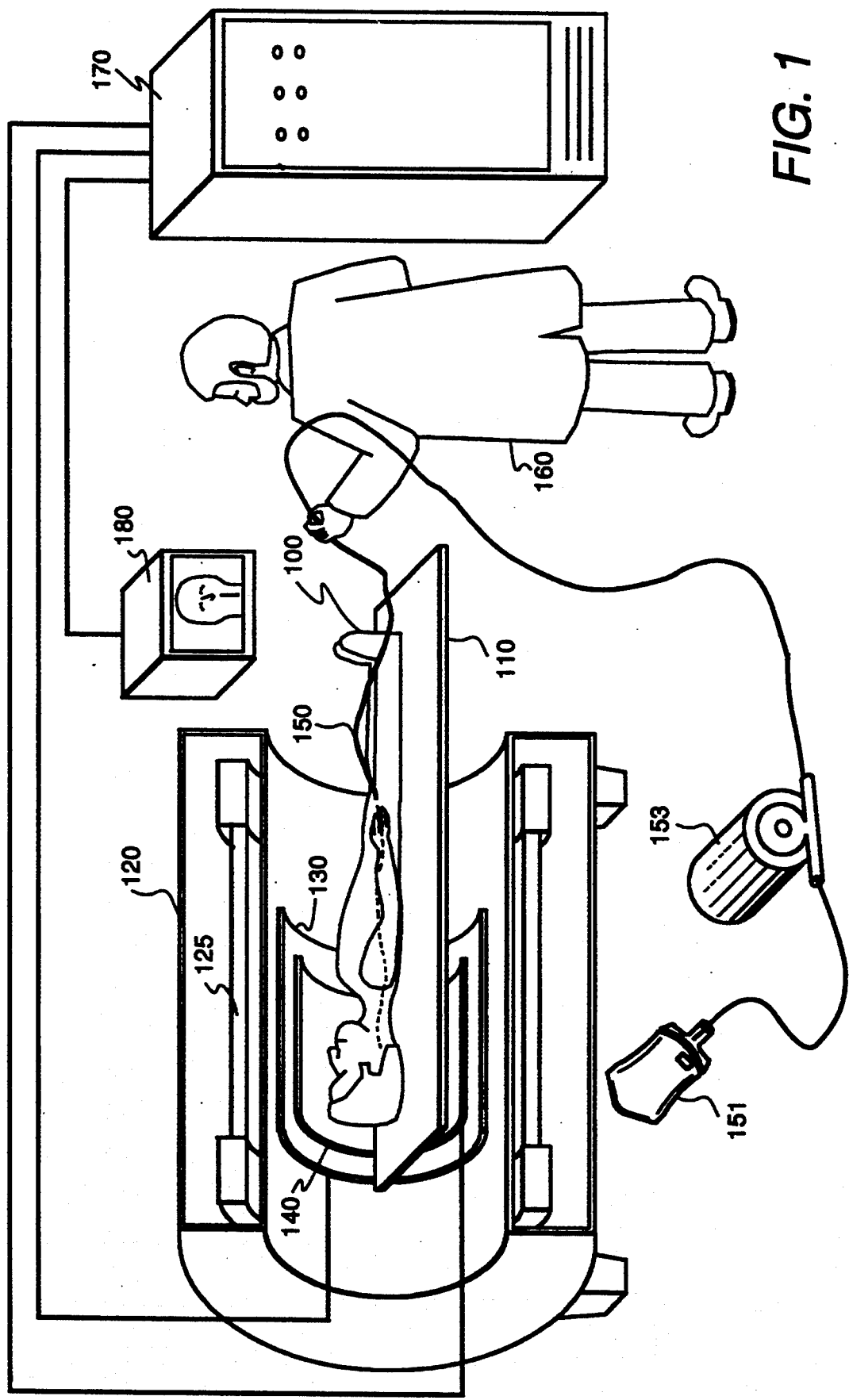
FIG. 1 is a perspective view of one embodiment of the present invention in operation in which a vessel selective angiogram is being obtained from a subject.

In FIG. 1, a subject 100 is placed on a support table 110 and positioned in a homogeneous magnetic field generated by a magnet 125 encased in a magnet housing 120. Magnet 125 and magnet housing 120 have cylindrical symmetry and are shown sectioned in half to reveal the position of subject 100. A region of interest of subject 100 is located in the approximate center of the bore of magnet 125. Subject 100 is surrounded by a set of cylindrical magnetic field gradient coils 130 which create magnetic field gradients of predetermined strength at predetermined times according to predetermined MR pulse sequences, described later. Gradient coils 130 generate magnetic field gradients in three mutually orthogonal directions. At least one external radio-frequency (RF) coil 140 (only one is shown in FIG. 1) also surrounds the region of interest of subject 100. In FIG. 1, RF coil 140 has a cylindrical shape with a diameter sufficient to encompass the entire subject. Other geometries, such as smaller cylinders specifically designed for imaging the head or an extremity, can be used in alternative embodiments. Non-cylindrical external radio-frequency coils, such as surface coils, may also be used. External RF coil 140 radiates radio-frequency energy into subject 100 at predetermined times and with sufficient power at a predetermined frequency so as to nutate a population of nuclear magnetic spins, hereinafter referred to as 'spins', of subject 100 in a fashion well known to those skilled in the art. External RF coil 140 can also act as a receiver, detecting the MR response signals which are stimulated by nutation.

The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

A Faraday catheter 150 is inserted into a region of interest of subject 100 by an operator 160.

Figure 2:
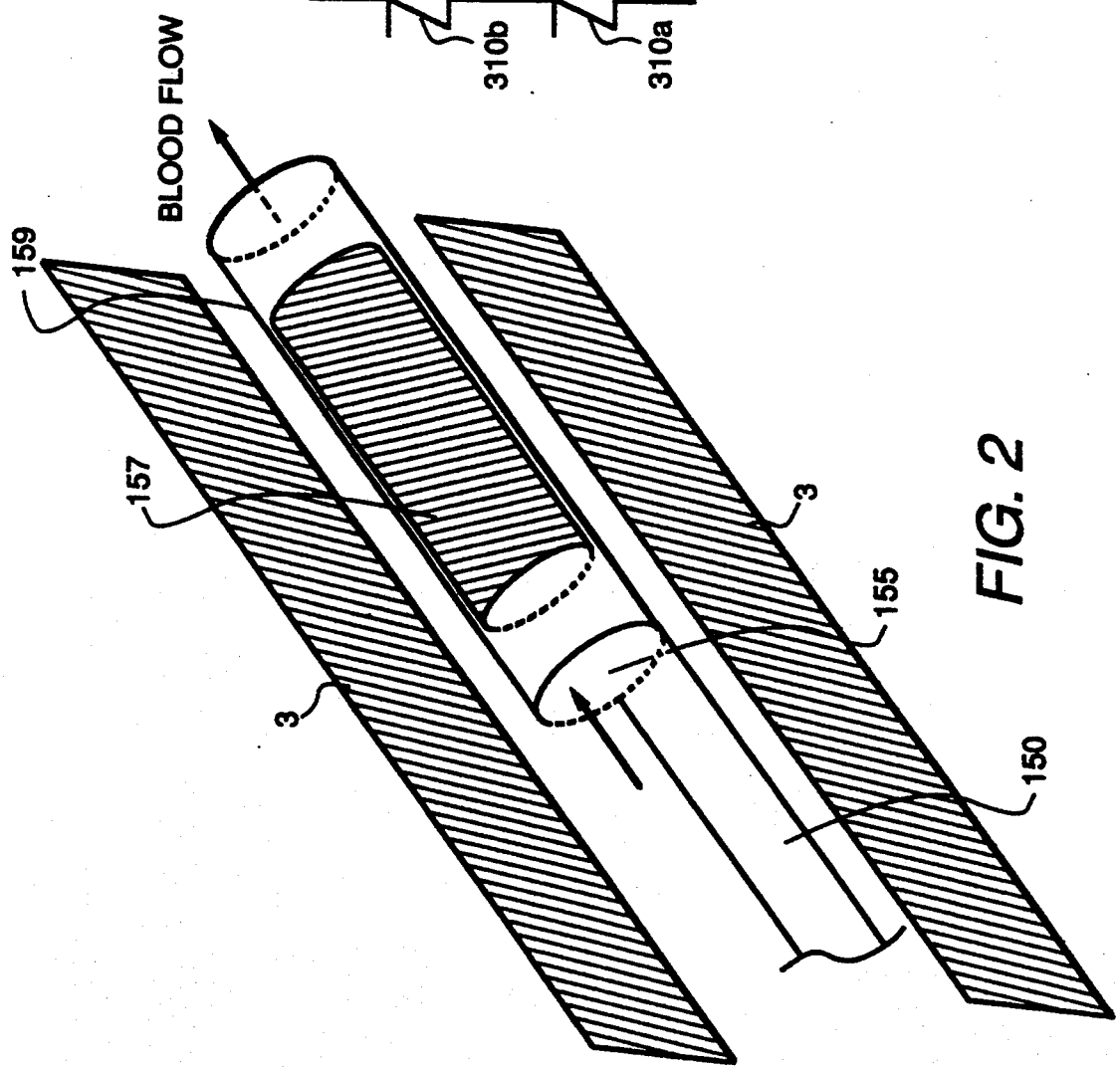
FIG. 2 is an illustration of a Faraday catheter intended to be inserted into the body of a subject, according to the present invention.

An embodiment of the Faraday catheter 150 is shown in greater detail in FIG. 2. Faraday catheter 150 is inserted into a vessel 3 of subject 100. The construction of Faraday catheter 150 is a critical aspect of the invention. Faraday catheter 150 need not be of a particular shape or size, but must incorporate a conducting sheath 157 around the lumen for a selected length near the end of the catheter. Conducting sheath 157 acts to form a Faraday cage around a lumen 155, substantially preventing radio-frequency energy from acting on any MR-active material within. For safety reasons, it may be desirable to electrically insulate the conducting sheath from subject 100 with insulator 159. Note that sheath 157 need not be constructed from a solid sheet of conductor. Designs in which the sheath may be made with a braid, mesh or wires are feasible.

Once Faraday catheter 150 is in place, a conventional MR imaging sequence is started. Most conventional MR imaging sequences work well for this application provided the flip angle of the RF excitation pulse is made relatively large and the repetition time, TR, is relatively short. The large flip angle and short TR causes spin saturation and results in a low signal-to-noise ratio for all the spins which remain within the field-of-view during all or most of the image acquisition. Pulse sequences which should prove useful include 3 D gradient recalled sequences, sequential thin-slice 2 D sequences, projective 2 D sequences, time resolved (i.e. cine) sequences, phase-contrast sequences and segmented and spiral K-space sequences.

Immediately before and during the pulse sequence, an MR active fluid 151 (one that will image well in MR imaging) is injected through Faraday catheter 150, with the use of a pump 153 of FIG. 1, if necessary. Fluid 151 is ideally a strong MR signal source. Several preferable choices for fluid 151 are:

1) physiological saline solution (possibly doped with a relaxation agent such as gadolinium chelated with diethylene triamine penta acetic acid (Gd-DTPA)
2) Blood from the patient (possibly doped -with a relaxation agent). This blood does not need to be removed from the patient (i.e. the catheter could include a pump and move blood from a port located outside the MR image volume but still within the body).
3) Whole blood or plasma from a donor;
4) a blood substitute such as fluoridated hydrocarbons capable of carrying oxygen to tissue.

Since the fluid exiting the Faraday catheter is shielded from the effects of the imaging sequence's RF pulses, it enters vessel 3 of subject 100 in a fully relaxed state. Immediately after exiting Faraday catheter 150, it is exposed to RF pulses, thereby causing a strong transverse magnetization, $M_T$, which will later dissipate to a steady-state value after being exposed to repeated RF pulses. Consequently, it gives a relatively strong MR signal before dissipating to its steady-state. Conversely, 'spins' which are not shielded by Faraday catheter 150 are exposed to a plurality of RF pulses, causing them to be in a saturated steady-state, thereby producing a reduced MR response signal when compared with the MR response signal from the fluid from Faraday catheter 150. The MR response signals received at RF coil 140 are passed to MR imaging electronics, shown here as cabinet 170 to perform image reconstruction as commonly known in the art, and then display the MR angiographic image on a display 180. Since Faraday catheter 150 causes the MR signal to be stronger from fluid 151 which has passed through Faraday catheter 150, the MR imaging sequence and image reconstruction would simply be that for standard imaging of stationary tissue without the need to particularly image moving tissue, since the Faraday catheter causes the contrast of the fluid to appear in the reconstructed image. Also, since the enhanced contrast appears only in the fluids which have passed through Faraday catheter 150, other fluids in the nearby vicinity, are not confused with fluid from Faraday catheter 150 allowing excellent fluid dynamics studies. The present invention also functions well to provide excellent vessel contrast even in situations in which the vessel tree is moving and/or is adjacent to a large pool of moving blood (as is found in coronary angiography), unlike other types of MR angiography.

The flip angle and sequence repetition time, TR, of the MR pulse sequence are chosen to maximize the visualization of the fluid exiting the catheter. T1 relaxation agents such as Gd-DTPA can be added to the fluid to decrease it's T1. This makes fluid 151 more difficult to saturate as it moves through an image volume, thereby taking a longer time to reach its steady-state, enabling visualization of relatively longer lengths along vessels and/or vessel trees.

In an alternative embodiment, small RF coils may be attached to Faraday catheter 150 which are then tracked by MR tracking or RF tracking.

In a another embodiment, fluid 151 employs fluoridated blood substitutes, and an MR imaging sequence for fluorine ($^{19}F$) is employed.

Figure 3B:
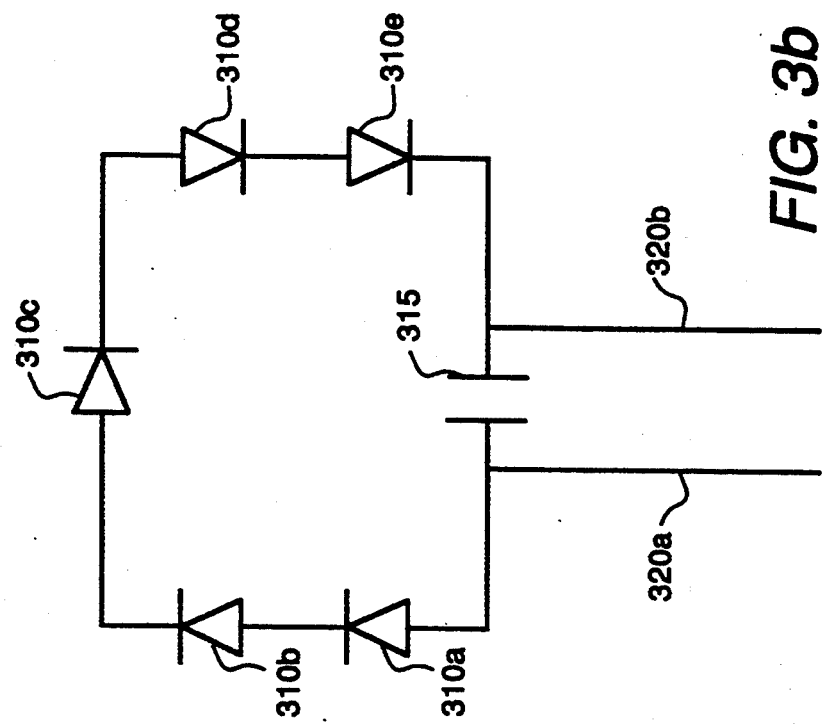
Figure 3A:
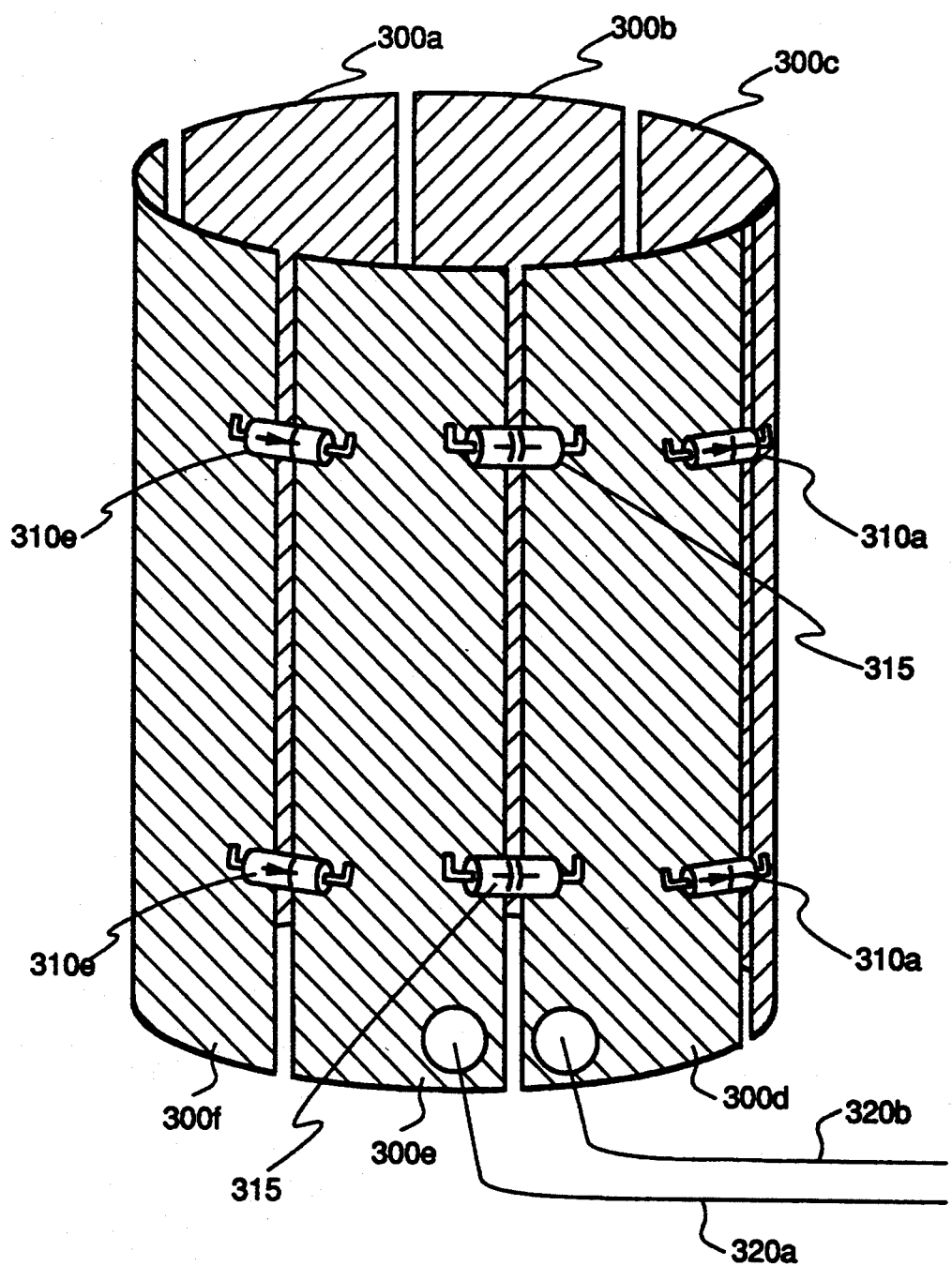
FIG. 3a is a perspective view of a second embodiment of Faraday catheter according to the present invention.

In still another embodiment, a dynamic Faraday cage capable of being activated or deactivated by an external signal is shown in FIG. 3. This can be accomplished by dividing the Faraday cage into a plurality of N segments, 300a, 300b, 300c, . . . 300n and connecting each segment with one or more diodes 310. The cage can then be activated by applying a DC bias to the diodes through a pair of leads 320a, 320b. One or more capacitors 315 can be placed across the first and last segments 300a, 300n so that the Faraday cage is complete. Reverse biasing can be used to guarantee deactivation of the Faraday cage even in the presence of RF pulses, if desired.

This invention should permit the acquisition of high-quality coronary MR angiograms on conventional MR imaging systems with minimum modifications. Although it will be more invasive than conventional MR angiography, the enhancement in image quality will be substantial. Use of this invention with an open magnet should permit cardiologist to perform angiography in much the same way as is currently performed with conventional X-ray angiography methods.

While several presently preferred embodiments of the novel invention have been described in detail herein, many modifications and variations will now become apparent to those skilled in the art. It is, therefore, to be understood that the appended claims are intended to cover all such modifications and variations as fall within the true spirit of the invention.

What is claimed is:

1. A magnetic resonance (MR) imaging system for obtaining vessel-selective MR angiographic images from a subject comprising:
   a) magnet means for applying a homogeneous magnetic field having substantially uniform amplitude over said subject;
   b) a Faraday catheter adapted to be inserted within said subject comprised of a conductive sheath means for surrounding a lumen and shielding fluid within the lumen from RF energy thereby causing the fluid to remain in the relaxed state;
   c) an RF transmitter means located external to said subject for transmitting RF energy into said subject of a selected duration, amplitude and frequency to cause nutation of a first ensemble of spins within said subject but outside of the Faraday catheter, but leaving a second ensemble of spins in a relaxed state within the Faraday catheter;
   d) a gradient means for varying the amplitude of the magnetic field over said subject in at least one spatial dimension over time;
   e) an RF receive coil means for detecting MR response signals from the first ensemble of nutated spins, and from the second ensemble of nutated spins within said subject;
   f) a reconstruction means for receiving the MR response signals and creating an angiographic image from the detected MR response signals in which the second selected ensemble of spins are differentiated first selected ensemble of spins, coupled to the RF receive coil means;
   g) a controller means for activating the RF transmitter means, the receiver coil means, the reconstruction means and the gradient means each according to a predetermined MR imaging pulse sequence, being connected to the RF transmitter means, the receive coil means, the reconstruction means and the gradient means; and
   h) a display means for displaying the angiographic image with the selected vessels of said subject being visible, being connected to the reconstruction means.

2. The magnetic resonance (MR) imaging system for obtaining vessel-selective MR angiographic images of claim 1 wherein the conductive sheath means comprises:
   a) a plurality of conductive plates positioned to enclose at least a portion of the lumen;
   b) at least one capacitor joining a selected two of the conductive plates;
   c) a plurality of diodes, with each diode connected to two plates in a direction allowing current to flow through the plurality of conductive plates in a single direction around the lumen;
   d) biasing means for providing a forward bias to the diodes activating the Faraday catheter, the biasing means also for reverse biasing the diodes to inactivate the Faraday catheter.

3. The magnetic resonance (MR) imaging system for obtaining vessel-selective MR angiographic images of claim 1 further comprising a fluid propulsion means for moving fluid through the Faraday catheter.

4. A method for obtaining a vessel-selective magnetic resonance (MR) angiographic image from a subject comprising the steps off
   a) applying a homogeneous magnetic field having substantially uniform amplitude over said subject;
   b) inserting a Faraday catheter having a conductive sheath and a lumen, into a selected vessel of said subject such that fluid will flow through the lumen into the vessel;
   c) transmitting RF energy into said subject of a selected duration, amplitude and frequency to cause nutation of a first selected ensemble of spins such that fluid inside the lumen is shielded, but is nutated as it exits the lumen;
   d) varying the amplitude of the magnetic field over at least one spatial dimension with respect to time;
   e) detecting a plurality of MR response signals from the selected ensemble of spins; and
   f) calculating an MR angiographic image of the selected vessel from the detected MR response signals.

* * * * *